(12) United States Patent
Nozaki et al.

(10) Patent No.: US 11,623,284 B2
(45) Date of Patent: Apr. 11, 2023

(54) SURFACE-COATED CUTTING TOOL

(71) Applicant: NGK SPARK PLUG CO., LTD., Nagoya (JP)

(72) Inventors: Shota Nozaki, Nagoya (JP); Ryoji Toyoda, Nagoya (JP)

(73) Assignee: NGK SPARK PLUG CO., LTD., Aichi (JP)

( * ) Notice: Subject to any disclaimer, the term of this patent is extended or adjusted under 35 U.S.C. 154(b) by 0 days.

(21) Appl. No.: 17/297,658

(22) PCT Filed: Nov. 27, 2019

(86) PCT No.: PCT/JP2019/046411
§ 371 (c)(1),
(2) Date: May 27, 2021

(87) PCT Pub. No.: WO2020/137325
PCT Pub. Date: Jul. 2, 2020

(65) Prior Publication Data
US 2022/0001457 A1   Jan. 6, 2022

(30) Foreign Application Priority Data
Dec. 27, 2018 (JP) .............................. JP2018-243984

(51) Int. Cl.
*B23B 27/14* (2006.01)
*C04B 35/10* (2006.01)
(Continued)

(52) U.S. Cl.
CPC ............ *B23B 27/148* (2013.01); *C04B 35/10* (2013.01); *C04B 35/584* (2013.01);
(Continued)

(58) Field of Classification Search
CPC ... B23B 27/14; B23B 27/148; C23C 14/0641; C04B 2235/3847
(Continued)

(56) References Cited

U.S. PATENT DOCUMENTS 4,842,710 A * 6/1989 Freller ................ C23C 14/0641
427/580
5,981,049 A * 11/1999 Ohara ................. C23C 14/0641
204/192.15
(Continued)

FOREIGN PATENT DOCUMENTS

JP     06-340481 A    12/1994
JP     2000-326111 A  11/2000
(Continued)

OTHER PUBLICATIONS

Notice of Reasons for Refusal dated Nov. 30, 2021 from the Japanese Patent Office in corresponding JP Application No. 2020-507140.
(Continued)

*Primary Examiner* — David Sample
(74) *Attorney, Agent, or Firm* — Sughrue Mion, PLLC

(57) ABSTRACT

A surface-coated cutting tool including a tool substrate containing WC crystal grains and insulating grains, and a coating layer composed of a multiple nitride of Ti, Al, and V and disposed on the surface of the tool substrate. The multiple nitride is represented by a compositional formula: $Ti_aAl_bV_cN$ satisfying the following relations:

$0.25 \leq a \leq 0.35$, $0.64 \leq b \leq 0.74$, $0 < c \leq 0.06$, and $a+b+c=1$ (Continued)

wherein each of a, b, and c represents an atomic proportion. The coating layer is characterized by exhibiting a peak attributed to a hexagonal crystal phase and a peak attributed to a cubic crystal phase as observed through X-ray diffractometry.

5 Claims, 4 Drawing Sheets

(51) Int. Cl.
| | |
|---|---|
| *C04B 35/584* | (2006.01) |
| *C04B 35/597* | (2006.01) |
| *C04B 37/02* | (2006.01) |
| *C04B 41/00* | (2006.01) |
| *C04B 41/50* | (2006.01) |
| *C04B 41/87* | (2006.01) |
| *C23C 14/06* | (2006.01) |
| *C23C 16/30* | (2006.01) |
| *C23C 16/34* | (2006.01) |

(52) U.S. Cl.
CPC .......... *C04B 35/597* (2013.01); *C04B 37/023* (2013.01); *C04B 41/009* (2013.01); *C04B 41/5068* (2013.01); *C04B 41/87* (2013.01); *C23C 14/0617* (2013.01); *C23C 14/0641* (2013.01); *C23C 16/303* (2013.01); *C23C 16/34* (2013.01); *B23B 2228/10* (2013.01); *C04B 2235/3217* (2013.01); *C04B 2235/3847* (2013.01); *C04B 2235/3873* (2013.01); *C04B 2235/3895* (2013.01); *C04B 2237/343* (2013.01); *C04B 2237/368* (2013.01); *C04B 2237/401* (2013.01)

(58) Field of Classification Search
USPC .......................................... 428/697, 698, 699
See application file for complete search history.

(56) References Cited

U.S. PATENT DOCUMENTS

| | | | |
|---|---|---|---|
| 6,767,658 B2 | 7/2004 | Yamamoto et al. | |
| 7,811,683 B2 | 10/2010 | Zhu et al. | |
| 10,625,347 B2 | 4/2020 | Tatsuoka et al. | |
| 2003/0148145 A1 | 8/2003 | Yamamoto et al. | |
| 2008/0075543 A1 | 3/2008 | Zhu et al. | |
| 2018/0281077 A1* | 10/2018 | Tanaka | C23C 14/325 |
| 2018/0311742 A1 | 11/2018 | Tatsuoka et al. | |
| 2019/0076933 A1* | 3/2019 | Nishizawa | C23C 14/0641 |

FOREIGN PATENT DOCUMENTS

| | | | | |
|---|---|---|---|---|
| JP | 2003-034858 A | 2/2003 | | |
| JP | 2003-165003 A | 6/2003 | | |
| JP | 2009-050997 A | 3/2009 | | |
| JP | 2009-202244 A | 9/2009 | | |
| JP | 2015-163424 A | 9/2015 | | |
| JP | 2016-113320 A | 6/2016 | | |
| JP | 2017-080883 A | 5/2017 | | |
| JP | 2018-161739 A | 10/2018 | | |
| WO | WO-2017170603 A1 * | 10/2017 | ............ | B23B 27/14 |
| WO | 2017-170603 | * | 12/2018 | |

OTHER PUBLICATIONS

Office Action dated May 6, 2021 in corresponding Japanese Patent Application No. 2020-507140.
International Search Report for PCT/JP2019/046411 dated Jan. 28, 2020 (PCT/ISA/210).

* cited by examiner

SURFACE-COATED CUTTING TOOL

CROSS REFERENCE TO RELATED APPLICATIONS

This application is a National Stage of International Application No. PCT/JP2019/046411 filed Nov. 27, 2019, claiming priority based on Japanese Patent Application No. 2018-243984 filed Dec. 27, 2018.

TECHNICAL FIELD

The present invention relates to a surface-coated cutting tool.

BACKGROUND ART

Patent Document 1 discloses a technique for coating a cemented carbide substrate with a hard film composed of (TiAlV)(CN). The patent document describes that high strength can be secured in the film by controlling the amounts of Ti, Al, V, C, and N contained in the film and forming the film to mainly have a rock-salt-type crystal structure.

Patent Document 2 discloses a technique for coating a cemented carbide substrate with a hard film containing Al, Ti, Cr, N, and O. The patent document describes that the hard film exhibits excellent oxidation resistance and wear resistance when the film has an NaCl-type crystal structure and the diffraction intensity obtained from (200) plane is higher than that obtained from (111) plane.

PRIOR ART DOCUMENTS

Patent Documents

Patent Document 1: Japanese Patent Application Laid-Open (kokai) No. 2003-034858
Patent Document 2: Japanese Patent Application Laid-Open (kokai) No. 2003-165003

SUMMARY OF THE INVENTION

Problem to be Solved by the Invention

In view of high-efficiency machining, increasing demand has recently arisen for a cutting tool exhibiting excellent wear resistance in a high-speed cutting process. Under high-speed cutting conditions, the temperature of the edge of a cutting tool tends to increase by heat generated during cutting.

According to Patent Document 1, when the substrate is formed of a cemented carbide, the service life of the tool can be prolonged by suppressing generation of hexagonal crystals in the hard film. However, in the case of a cemented carbide substrate, the tool may be damaged by heat generated during high-speed cutting, since the cemented carbide contains a component that softens at high temperature (e.g., Co).

When the hard film has a solo cubic phase as described in Patent Document 2, the hard film may have insufficient heat resistance, and thus oxidation reaction of the hard film may proceed by heat generated during high-speed cutting. The oxidation of the hard film may lead to a reduction in hardness of the hard film, resulting in wear of the cutting tool.

In view of the foregoing, an object of the present invention is to provide a surface-coated cutting tool exhibiting excellent wear resistance in a high-speed cutting process and having prolonged service life. The present invention can be implemented in the following modes.

Means for Solving the Problem

[1] A surface-coated cutting tool comprising a tool substrate containing WC crystal grains and insulating grains, and a coating layer composed of a multiple nitride (i.e., a composite nitride) of Ti, Al, and V and disposed on the surface of the tool substrate, characterized in that the multiple nitride is represented by a compositional formula: $Ti_aAl_bV_cN$ satisfying the following relations:

$$0.25 \leq a \leq 0.35,$$

$$0.64 \leq b \leq 0.74,$$

$$0 < c \leq 0.06, \text{ and}$$

$$a+b+c=1$$

(wherein each of a, b, and c represents an atomic proportion); and the coating layer exhibits a peak attributed to a hexagonal crystal phase (hereinafter referred to simply as a "hexagonal phase") and a peak attributed to a cubic crystal phase (hereinafter referred to simply as a "cubic phase") as observed through X-ray diffractometry.

Since the tool substrate of this surface-coated cutting tool does not substantially contain a component that softens at high temperature (e.g., Co), the damage of the tool by heat generated during high-speed cutting can be suppressed.

Furthermore, since the tool substrate containing WC crystal grains and insulating grains is coated with the coating layer having a hexagonal phase, an increase in the temperature of the cutting edge of the tool can be suppressed by the effect of the hexagonal phase in increasing thermal conductivity. Thus, the service life of the surface-coated cutting tool can be prolonged.

Also, since the coating layer has both a hexagonal phase and a cubic phase, the oxidation tolerant temperature (oxidation initiation temperature) of the coating layer is higher than that of a coating layer having a solo cubic phase. Thus, the oxidation reaction of the coating layer by heat generated during high-speed cutting is reduced, and the coating layer exhibits improved wear resistance in a high-speed cutting process.

In the surface-coated cutting tool, the coating layer composed of a multiple nitride of Ti, Al, and V represented by a specific compositional formula is disposed on the surface of the tool substrate containing WC crystal grains and insulating grains. Thus, the hexagonal phase and the cubic phase are intermingled (dispersed) in a well-balanced manner, and the cutting tool can exhibit both the effect of the property attributed to the hexagonal phase and the effect of the property attributed to the cubic phase.

[2] A surface-coated cutting tool as described in [1] above, wherein the coating layer exhibits a peak intensity ratio (IA/IB) of 0.43 or more and 0.86 or less as determined through X-ray diffractometry, wherein IA represents the intensity of the peak attributed to (100) plane of the hexagonal phase, and IB represents the intensity of the peak attributed to (200) plane of the cubic phase.

When the peak intensity ratio (IA/IB) falls within a range of 0.43 or more and 0.86 or less, the hexagonal phase and the cubic phase are intermingled in a well-balanced manner, and the cutting tool can exhibit both the effect of the property attributed to the hexagonal phase and the effect of the property attributed to the cubic phase.

[3] A surface-coated cutting tool as described in [1] or [2] above, wherein the peak attributed to (200) plane of the cubic phase in the coating layer has the highest peak intensity as determined through X-ray diffractometry.

When the peak attributed to (200) plane of the cubic phase has the highest peak intensity, the coating layer exhibits improved wear resistance in a high-speed cutting process.

[4] A surface-coated cutting tool as described in any of [1] to [3] above, wherein the insulating grains are composed of at least one species selected from the group consisting of $Al_2O_3$, SiAlON, and silicon nitride.

When the substrate contains insulating grains composed of $Al_2O_3$, silicon nitride, SiAlON, and the like, wear resistance in a high-speed cutting process is improved.

[5] A surface-coated cutting tool as described in any of [1] to [4] above, wherein the tool substrate is bonded to a base via a brazing material, and the base is formed of a cemented carbide.

According to the above configuration, the tool substrate is bonded to a base formed of a material less expensive than the tool substrate. Thus, cost reduction can be achieved while the aforementioned cutting properties are secured.

Effects of the Invention

The present invention can provide a surface-coated cutting tool exhibiting excellent wear resistance in a high-speed cutting process and having prolonged service life.

MODES FOR CARRYING OUT THE INVENTION

1. Structure of Surface-Coated Cutting Tool

Figure 1:
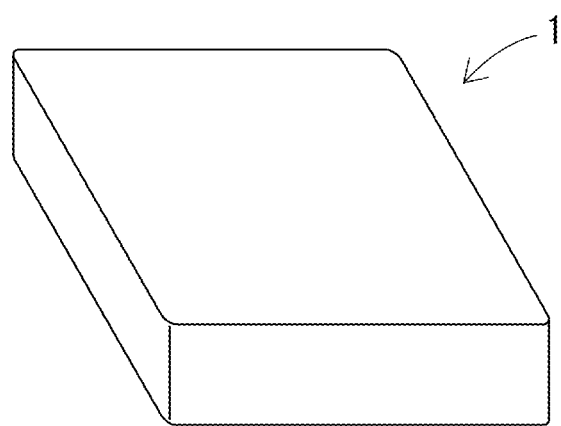
FIG. 1 is a perspective view of an exemplary insert.

The surface-coated cutting tool includes a tool substrate containing WC crystal grains and insulating grains, and a coating layer composed of a multiple nitride of Ti, Al, and V and disposed on the surface of the tool substrate. The multiple nitride is represented by a compositional formula: $Ti_aAl_bV_cN$ satisfying the following relations:

$0.25 \leq a \leq 0.35$, $0.64 \leq b \leq 0.74$, $0 < c \leq 0.06$, and $a+b+c=1$ (wherein each of a, b, and c represents an atomic proportion).

The coating layer exhibits a peak attributed to a hexagonal phase and a peak attributed to a cubic phase as observed through X-ray diffractometry.

(1) Tool Substrate

The tool substrate contains WC (tungsten carbide) crystal grains and insulating grains. The tool substrate is a ceramic sintered body substantially composed of WC crystal grains and insulating grains and does not substantially contain a component that softens at high temperature. As used herein, the term "a component that softens at high temperature" refers to, for example, a metal having a melting point of generally 1,600° C. or lower (e.g., Co, Fe, or Ni) for use in a high-speed cutting process. The ceramic sintered body may contain an impurity inevitable in production. The expression "the tool substrate does not substantially contain a component" may refer to the case where the tool substrate does not contain the component at all, or the case where the tool substrate contains the component in such a small amount that the component does not influence the effects of the tool substrate (e.g., in an amount corresponding to that of an inevitable impurity).

No particular limitation is imposed on the insulating grains, and the insulating grains may be composed of at least one species selected from the group consisting of $Al_2O_3$ (alumina), SiAlON, and silicon nitride. The present inventors have found that use of a tool substrate containing such insulating grains achieves improved wear resistance in a high-speed cutting process. This is probably attributed to that non-uniform voltage distribution occurs during formation of a coating layer on the surface of the tool substrate containing the aforementioned insulating grains, resulting in distribution of compressive stress applied to the coating layer. This compressive stress distribution is assumed to cause the coating layer to have a hexagonal and cubic mixed phase.

No particular limitation is imposed on the amounts of WC crystal grains and insulating grains. The amount of WC may be 20 vol % to 80 vol % relative to the entirety of the tool substrate (taken as 100 vol %), wherein the balance is a compound forming the insulating grains (e.g., $Al_2O_3$, SiAlON, or silicon nitride). When the amount of WC is 20 vol % or more, the tool substrate exhibits increased strength and hardness. When the amount of WC is 80 vol % or less, a sufficient amount of the insulating grains can be secured, and preferred voltage distribution is achieved during formation of the coating layer on the tool substrate. As used herein, the term "vol % (% by volume) of a component" refers to the proportion of the component relative to the total volume (taken as 100%) of all the components contained in the tool substrate.

(2) Coating Layer

In the surface-coated cutting tool, the coating layer is formed on the surface of the tool substrate. The coating layer is formed of a multiple nitride of Ti, Al, and V. The multiple nitride is represented by a compositional formula: $Ti_aAl_bV_cN$ satisfying the following relations:

$0.25 \leq a \leq 0.35$, $0.64 \leq b \leq 0.74$, $0 < c \leq 0.06$, and $a+b+c=1$.

The coating layer is a single coating layer having substantially a homogeneous element composition, and no interface, which would have been generated due to difference in element composition, is observed in the coating layer under an SEM (scanning electron microscope).

In the compositional formula $Ti_aAl_bV_cN$, a satisfies the relation: $0.25 \leq a \leq 0.35$, preferably $0.26 \leq a \leq 0.35$; b satisfies the relation: $0.64 \leq b \leq 0.74$, preferably $0.64 \leq b \leq 0.70$; and c satisfies the relation: $0 < c \leq 0.06$, preferably $0 < c \leq 0.05$, more preferably $0 < c \leq 0.04$.

When a, b, and c of $Ti_aAl_bV_cN$ satisfy the aforementioned relations, the cutting tool exhibits improved wear resistance in a high-speed cutting process.

For example, when b decreases in the aforementioned compositional formula, the proportion of a hexagonal phase becomes small in the coating layer (including the case where no generation of a hexagonal phase is determined), whereas when b increases in the compositional formula, the proportion of a hexagonal phase tends to become large in the coating layer. Thus, when b falls within the aforementioned range, the coating layer can have a cubic phase and a hexagonal phase in appropriate proportions, and exhibit properties attributed to both the cubic phase and the hexagonal phase. The properties attributed to both the cubic phase and the hexagonal phase will be described in detail below.

In the coating layer, "c is more than 0"; i.e., V is an essential component. Incorporation of V can improve the slidability between the coating layer and a work material. V has a low oxidation initiation temperature and preferentially adsorbs oxygen, to thereby form $V_2O_5$. $V_2O_5$ is expected to exhibit the effect of achieving a good slidability between the coating layer and a work material. However, when "c is more than 0.06," the effect of $V_2O_5$ is dominant, resulting in a tendency of decreased hardness and heat resistance of the coating layer. When c satisfies the relation "$0 < c \leq 0.06$," a good slidability can be achieved between the coating layer and a work material while the hardness and heat resistance of the coating layer are maintained.

No particular limitation is imposed on the thickness of the coating layer composed of a multiple nitride of Ti, Al, and V. The thickness of the coating layer is preferably 0.5 μm or more, more preferably 0.8 μm or more, particularly preferably 1.5 μm or more, in order to secure satisfactory wear resistance. The thickness of the coating layer is generally 10 μm or less.

The thickness of the coating layer can be measured through observation of a cut surface of the surface-coated cutting tool under an SEM.

Figure 3A:
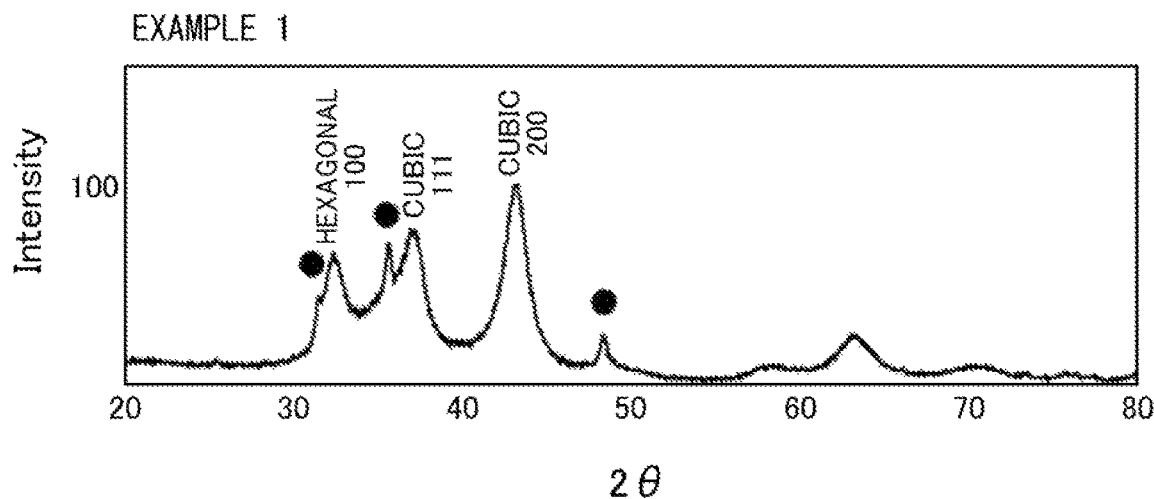
FIG. 3(A) is an explanatory view showing the results of analysis of a coating layer through X-ray diffractometry in Example 1.
Figure 3B:
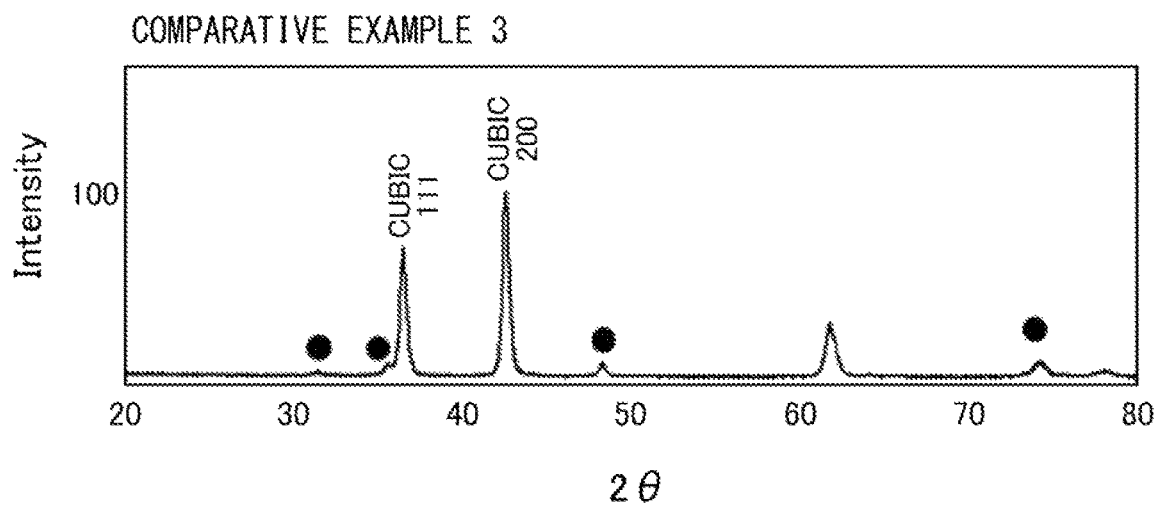
FIG. 3(B) is an explanatory view showing the results of analysis of a coating layer through X-ray diffractometry in Comparative Example 3 (FIG. 3(B)).

The coating layer has both a hexagonal phase and a cubic phase. The co-presence of the hexagonal phase and the cubic phase can be determined through X-ray diffractometry of the coating layer. FIGS. 3(A) and 3(B) show exemplary results of X-ray diffraction analysis by means of an X-ray diffractometer using Cu-Kα rays. In FIGS. 3(A) and 3(B), the horizontal axis represents the diffraction angle 2θ of a peak, and the vertical axis represents diffraction intensity (the intensity of the peak attributed to (200) plane of the cubic phase is taken as 100). The peaks attributed to (111) plane of the cubic phase, (200) plane of the cubic phase, and (100) plane of the hexagonal phase are observed at positions described below. The presence of the hexagonal phase and the cubic phase can be determined by the presence or absence of the peaks at these positions. As shown in FIG. 3(A), both the hexagonal phase and the cubic phase are present in the coating layer of an example of the present invention; i.e., the peaks attributed to the hexagonal phase and the cubic phase are observed. In contrast, as shown in FIG. 3(B), the hexagonal phase is absent in the coating layer having a composition falling outside the scope of the present invention; i.e., no peak is observed at around 32.6°. In FIGS. 3(A) and 3(B), the symbol "•(black circle)" corresponds to a peak attributed to WC.

Peak attributed to (111) plane of the cubic phase: 37.7°
Peak attributed to (200) plane of the cubic phase: 43.8°
Peak attributed to (100) plane of the hexagonal phase: 32.6°

In the present embodiment, the coating layer preferably exhibits a specific peak intensity ratio (IA/IB) as determined through X-ray diffractometry, wherein IA represents the intensity of the peak attributed to (100) plane of the hexagonal phase, and IB represents the intensity of the peak attributed to (200) plane of the cubic phase.

Specifically, the peak intensity ratio (IA/IB) is preferably 0.43 or more and 0.86 or less, more preferably 0.43 or more and 0.62 or less.

The peak intensity ratio (IA/IB) corresponds to the ratio of the amount of the hexagonal phase to that of the cubic phase, and is preferably 0.43 or more and 0.86 or less. The aforementioned tool substrate substantially containing WC crystal grains and insulating grains exhibits superior hardness, but poor heat dissipation as compared with, for example, cemented carbide; i.e., the temperature of the edge of a cutting tool including the tool substrate tends to increase. Thus, effective means is to increase the thermal conductivity of the coating layer. A peak intensity ratio (IA/IB) of less than 0.43 causes the cubic phase to have a dominant influence. This leads to an increase in hardness of the coating layer, but results in impaired oxidation resistance of the coating layer due to insufficient thermal conductivity. Thus, the oxidation reaction of the coating layer may be promoted by heat generated during high-speed cutting, resulting in impaired wear resistance of the coating layer in a high-speed cutting process.

Meanwhile, a peak intensity ratio (IA/IB) of more than 0.86 causes the hexagonal phase to have a dominant influence. This may lead to an increase in the thermal conductivity of the coating layer, but lead to a decrease in the hardness of the coating layer, resulting in impaired wear resistance of the coating layer.

When the peak intensity ratio (IA/IB) falls within the aforementioned range, the coating layer can achieve both the effect of the property attributed to the hexagonal phase and the effect of the property attributed to the cubic phase.

In the present embodiment, the peak attributed to (200) plane of the cubic phase in the coating layer preferably has the highest peak intensity as determined through X-ray diffractometry. When the peak attributed to (200) plane of the cubic phase has the highest peak intensity, the coating layer exhibits improved wear resistance in a high-speed cutting process. The present inventors have found that the peak attributed to (200) plane of the cubic phase can have the highest peak intensity in the coating layer of the present embodiment, which has the composition wherein a, b, and c satisfy the aforementioned relations and which includes both a hexagonal phase and a cubic phase. The present inventors have also found that the tool of the present embodiment exhibits wear resistance superior to that of a tool including a coating layer which has a composition falling outside the scope of the present invention and in which the peak attributed to (111) plane of the cubic phase has the highest peak intensity. The present inventors have also found that when the orientation of (200) plane of the cubic phase is more preferential than that of (111) plane of the cubic phase in the tool including the Al-containing coating layer, the density of the coating layer becomes relatively high, and thus wear resistance is effectively improved. These findings lead to a presumption that the coating layer exhibits improved wear resistance in a high-speed cutting process when the peak attributed to (200) plane of the cubic phase has the highest peak intensity in the present embodiment. The preferential orientation of (200) plane of the cubic phase can be realized by elevating the temperature to a certain degree during formation of the coating layer.

(3) Coating Layer Other than Coating Layer Composed of Multiple Nitride of Ti, Al, and V The surface-coated cutting tool of the present embodiment may include another coating layer other than the single coating layer composed of a multiple nitride of Ti, Al, and V (hereinafter may be referred to as "additional coating layer").

No particular limitation is imposed on the additional coating layer, and the additional coating layer is preferably, for example, a layer composed of CrAlN. No particular limitation is imposed on the thickness of the additional coating layer. The additional coating layer may be located inside (tool substrate side) or outside the single coating layer composed of a multiple nitride of Ti, Al, and V. No particular limitation is imposed on the number of layers forming the additional coating layer, and the additional coating layer may have a single-layer or multi-layer structure. When the additional coating layer has a multi-layer structure, the additional coating layer may be formed of layers having the same composition or different compositions.

(4) Type of Surface-Coated Cutting Tool

The surface-coated cutting tool can be applied to a variety of conventionally known cutting tools used for a cutting process. Examples of preferred surface-coated cutting tools include edge-exchangeable tips for turning or milling (e.g., cutting insert and throw-away tip), drills, end mills, metal saws, gear cutting tools, reamers, and taps. The cutting tool of the present invention refers to a cutting tool in a broad sense and corresponds to general tools used for, for example, turning and milling.

The surface-coated cutting tool of the present embodiment can be suitably used as a cutting tool for, for example, high-speed machining of alloy steel.

Figure 2:
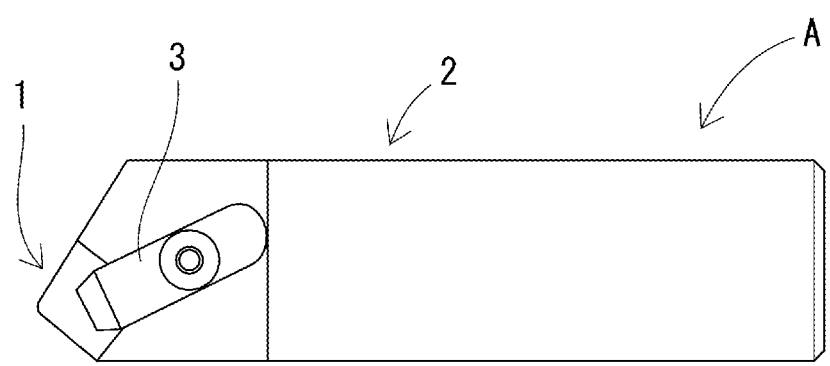
FIG. 2 is a plan view of an exemplary outer-diameter-finishing cutting tool including a holder and an insert attached thereto.

Now will be described an exemplary surface-coated cutting tool with reference to the drawings. FIG. 1 shows an insert 1, which is an exemplary surface-coated cutting tool. FIG. 2 shows an outer-diameter-finishing cutting tool A including the insert 1 attached thereto. The outer-diameter-finishing cutting tool A includes a holder 2 for outer diameter finishing, the insert 1 set in the holder 2, and a clasp 3 for clasping the inert 1.

Now will be described another exemplary surface-coated cutting tool with reference to the drawings. FIG. 4(B) shows an insert 10, which is an exemplary surface-coated cutting tool. FIG. 4(B) schematically shows the insert 10 (exclusive of a coating layer) for the sake of convenience of description. The insert 10 includes a base 13 and tool substrates 11 bonded to the base 13. The aforementioned coating layer is formed on the surfaces of the tool substrates 11 and the base 13 in the state where the tool substrates 11 are bonded to the base 13. The insert 10 has a rectangular parallelepiped shape corresponding to DNGA150408. The insert 10 may have a hole in the base 13 for fixing the insert 10 to a holder. Alternatively, the insert 10 may be fixed to a holder by means of another fixation structure.

Figure 4A:
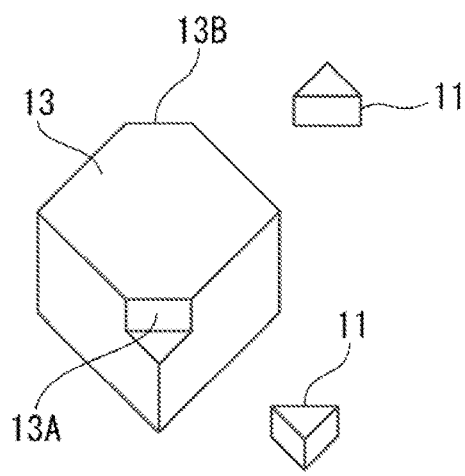
FIG. 4(A) is a perspective-view of the structures of a tool substrate and a base.
Figure 4B:
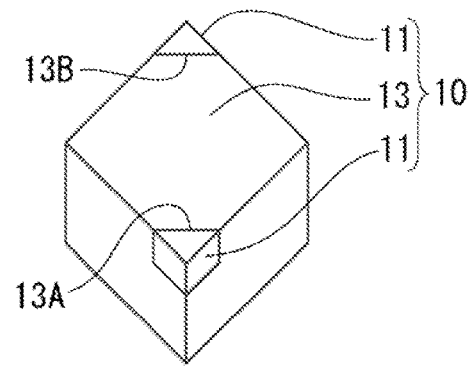
FIG. 4(B) is a perspective view of the structure of an insert.

As shown in FIG. 4(A), the tool substrates 11 have a triangular prism shape and form edge portions of the insert 10. The base 13 basically has a rectangular parallelepiped shape, and the base 13 is notched at two vertices 13A and 13B so as to fit the tool substrates 11. The tool substrates 11 are bonded to the base 13 at the two vertices 13A and 13B via a brazing material. The base 13 is formed of cemented carbide. The cemented carbide is composed of, for example, WC (tungsten carbide) and cobalt binder.

(5) Effects of Surface-Coated Cutting Tool of Embodiment

In the surface-coated cutting tool of the present embodiment, the tool substrate does not substantially contain a component that softens at high temperature. Thus, the damage of the tool by heat generated during high-speed cutting can be reduced.

Furthermore, since the tool substrate containing WC crystal grains and insulating grains is coated with the coating layer having a hexagonal phase, an increase in the temperature of the cutting edge of the tool can be suppressed, and the service life of the surface-coated cutting tool can be prolonged. In general, a tool substrate containing insulating grains having low thermal conductivity exhibits poor heat dissipation as compared with, for example, cemented carbide, and the temperature of the edge of a cutting tool including the tool substrate tends to increase. In the present embodiment, since the coating layer includes both hexagonal crystals and cubic crystals, the thermal conductivity of the coating layer is higher than that of a coating layer having a solo cubic phase, and heat dissipation from the coating layer having both a hexagonal phase and a cubic phase is promoted. Thus, even when the tool substrate containing insulating grains is used, the use of the coating layer having a hexagonal phase probably suppresses an increase in the temperature of the cutting edge. Since an increase in the temperature of the cutting edge is suppressed, the oxidation of the tool substrate is reduced, which probably results in improved wear resistance in a high-speed cutting process.

Since the coating layer has both a hexagonal phase and a cubic phase, the oxidation tolerant temperature (oxidation initiation temperature) of the coating layer is higher than that of a coating layer having a solo cubic phase. Thus, the oxidation reaction of the coating layer by heat generated during high-speed cutting is reduced, and the coating layer exhibits improved wear resistance in a high-speed cutting process.

In the present embodiment, the coating layer composed of a multiple nitride of Ti, Al, and V represented by a specific compositional formula is disposed on the surface of the tool substrate containing WC crystal grains and insulating grains. Thus, the hexagonal phase and the cubic phase are intermingled (dispersed) in a well-balanced manner, and the cutting tool can exhibit both the effect of the property attributed to the hexagonal phase and the effect of the property attributed to the cubic phase.

Therefore, there can be provided a surface-coated cutting tool exhibiting excellent wear resistance in a high-speed cutting process and having prolonged service life in the present embodiment.

In the case where the tool substrate is bonded to a base formed of a cemented carbide (for example, when the tool substrate is bonded to a base formed of a material less expensive than the tool substrate), cost reduction can be achieved while the aforementioned cutting properties are secured.

2. Production Method for Surface-Coated Cutting Tool

No particular limitation is imposed on the method for producing the surface-coated cutting tool. For example, a single coating layer composed of a multiple nitride of Ti, Al, and V can be formed on the surface of the tool substrate through arc ion plating. In this production method, a desired surface-coated cutting tool can be produced by controlling the conditions for forming the surface coating layer. In the present embodiment, when the coating layer formed on the surface of the tool substrate, which is composed of a multiple nitride of Ti, Al, and V, has a single-layer structure, the coating layer is formed by use of a single target (evaporation source); specifically an alloy target containing Al, Ti, and V. This formation involves the use of nitrogen gas as a reaction gas.

The composition of the surface coating layer and the crystal phase proportions can be tuned by controlling the amounts of Al, Ti, and V contained in the alloy target.

EXAMPLES

The present invention will next be described in more detail by way of examples.

1. Production of Surface-Coated Cutting Tool

In Examples 1 to 6 and Comparative Examples 1 to 4 and 6, a ceramic sintered body having a substrate composition (vol %) shown in Table 1 was used as the tool substrate. In Comparative Example 5, a cemented carbide having a substrate composition (vol %) shown in Table 1 was used as the tool substrate. In each of the Examples and Comparative Examples, the tip shape was ISO SNGN120408 202025. The tool substrate was placed in a cathode arc ion plating apparatus.

While the chamber of the apparatus was evacuated by means of a vacuum pump until a pressure of $3.0 \times 10^{-3}$ Pa was achieved in the chamber, the tool substrate was heated at 550° C. by means of a heater placed in the apparatus. Subsequently, argon gas was introduced into the apparatus so as to maintain a pressure of 1.0 Pa in the chamber, and the substrate bias voltage was gradually increased to −200 V, to thereby clean the surface of the tool substrate for 15 minutes. Thereafter, the argon gas was discharged.

Subsequently, an alloy target containing Al, Ti, and V was placed in the apparatus. While nitrogen gas serving as a reaction gas was introduced and the following conditions were maintained (substrate temperature: 550° C., reaction gas pressure: 1.0 Pa, and substrate bias voltage: −100 V), an arc current of 100 A was supplied to a cathode, and metal ions were generated from an arc evaporation source, to thereby form a coating layer (thickness: 1.5 µm) at a cutting edge. The evaporation source used in the present invention is characterized in that magnetic field lines extend to a work material, and the plasma density of a film formation gas in the vicinity of the work material is considerably high as compared with the case of a conventional evaporation source. The use of such an evaporation source reduces deposition of molten target material (which is called "macroparticles") on the surface of the coating layer, leading to improved surface roughness and improved cutting properties. Therefore, the use of this evaporation source is effective for formation of the coating layer.

Thus, surface-coated cutting tools of Examples 1 to 6 and Comparative Examples 1 to 6 were produced as shown in Table 1. The coating layer of each of the surface-coated cutting tools was analyzed by means of an X-ray diffractometer (RINT-TTR3, manufactured by Rigaku Corporation) using Cu-Kα rays.

In Examples 1 to 6 and Comparative Examples 1 to 6, the composition of the surface coating layer and the proportions of the crystalline phases were varied as shown in Table 1 through regulation of the amounts of Al, Ti, and V contained in the alloy target.

2. Wear Resistance Test

Each of the surface-coated cutting tools was used for cutting off under the conditions described below, and the wear width of the cutting edge was measured after 30 passes. The cutting conditions were as follows: work material: SCM415, cutting speed: 250 m/min, feed rate: 0.03 mm/rev, and cut: 0.2 mm. A cutting tool exhibiting a wear width of 60 µm or less under these conditions can be regarded as the surface-coated cutting tool of the present invention.

3. Test Results

Test results are shown in Table 1. In Table 1, "No hexagonal phase" corresponds to no observation of a peak attributed to a hexagonal phase as determined by means of an X-ray diffractometer (see FIG. 3(B); i.e., the results of analysis in Comparative Example 3).

| | Coating layer Composition | Substrate Composition | | | | | Crystal phase | IA/IB | Strongest peak | Wear width (µm) |
|---|---|---|---|---|---|---|---|---|---|---|
| | | WC | $Al_2O_3$ | $Si_3N_4$ | SiAlON | Co | | | | |
| Ex. 1 | $Ti_{0.35}Al_{0.64}V_{0.01}N$ | 30 | 70 | — | — | — | Cubic + Hexagonal | 0.56 | (200) | 48 |
| Ex. 2 | $Ti_{0.25}Al_{0.74}V_{0.01}N$ | 30 | 70 | — | — | — | Cubic + Hexagonal | 0.86 | (200) | 57 |
| Ex. 3 | $Ti_{0.29}Al_{0.70}V_{0.01}N$ | 30 | 70 | — | — | — | Cubic + Hexagonal | 0.63 | (200) | 52 |
| Ex. 4 | $Ti_{0.26}Al_{0.70}V_{0.04}N$ | 30 | 70 | — | — | — | Cubic + Hexagonal | 0.43 | (200) | 50 |
| Ex. 5 | $Ti_{0.26}Al_{0.70}V_{0.04}N$ | 30 | — | 70 | — | — | Cubic + Hexagonal | 0.64 | (200) | 52 |
| Ex. 6 | $Ti_{0.26}Al_{0.70}V_{0.04}N$ | 30 | — | — | 70 | — | Cubic + Hexagonal | 0.62 | (200) | 50 |
| Comp. Ex. 1 | $Ti_{0.20}Al_{0.79}V_{0.01}N$ | 30 | 70 | — | — | — | Cubic + Hexagonal | 1.6 | (111) | 96 |
| Comp. Ex. 2 | $Ti_{0.20}Al_{0.72}V_{0.08}N$ | 30 | 70 | — | — | — | Cubic + Hexagonal | 0.18 | (200) | 83 |
| Comp. Ex. 3 | $Ti_{0.36}Al_{0.60}V_{0.04}N$ | 30 | 70 | — | — | — | Cubic | No hexagonal | (200) | 88 |
| Comp. Ex. 4 | $Ti_{0.15}Al_{0.79}V_{0.06}N$ | 30 | 70 | — | — | — | Cubic + Hexagonal | 1.3 | (200) | 108 |
| Comp. Ex. 5 | $Ti_{0.35}Al_{0.64}V_{0.01}N$ | 90 | — | — | — | 10 | Cubic + Hexagonal | 0.03 | (200) | 87 |
| Comp. Ex. 6 | $Ti_{0.40}Al_{0.60}N$ | 30 | 70 | — | — | — | Cubic | No hexagonal | (200) | 76 |

The surface-coated cutting tools of Examples 1 to 6, in which the composition $Ti_aAl_bV_cN$ of the coating layer satisfied the following relations: $0.25 \leq a \leq 0.35$, $0.64 \leq b \leq 0.74$, and $0 < c \leq 0.06$, and the peaks attributed to the hexagonal phase and the cubic phase were observed, were found to have smaller wear width, as compared with the surface-coated cutting tools of Comparative Examples 1 to 6. Thus, the surface-coated cutting tools of Examples 1 to 6 were found to exhibit improved wear resistance in a high-speed cutting process.

In Comparative Example 1, a high Al content of the coating layer caused the hexagonal phase to have a dominant influence. Thus, the property intrinsic to the cubic phase failed to be achieved, which probably resulted in wear. In Comparative Example 1, the peak attributed to (111) plane of the cubic phase had the highest peak intensity, and thus the coating layer exhibited impaired wear resistance, which probably resulted in wear.

In Comparative Example 2, the coating layer had a high V content, and thus $V_2O_5$ exhibited a dominant effect in reducing the hardness and heat resistance of the coating layer, which probably resulted in wear.

In Comparative Example 3, a low Al content of the coating layer caused no generation of a hexagonal phase; i.e., generation of a solo cubic phase. Thus, the property of the hexagonal phase failed to be achieved, which probably resulted in wear.

In Comparative Example 4, the coating layer had a high Al content and a high V content, and thus the hexagonal phase had a dominant influence and $V_2O_5$ exhibited a dominant effect, which probably resulted in wear.

In Comparative Example 5, the tool substrate was formed of cemented carbide, and thus Co contained in the tool substrate softened at a high temperature, which probably resulted in wear. In Comparative Example 5, the tool substrate was formed of cemented carbide, and thus a hexagonal phase was insufficiently generated, which probably resulted in wear.

Comparative Example 6 corresponds to the case where the coating layer is formed of TiAlN containing no V. In Comparative Example 6, the coating layer contained no V, and thus failed to exhibit the effect of $V_2O_5$ in achieving a good slidability between the coating layer and a work material, which probably resulted in wear.

Now will be described the values of peak intensity ratio (IA/IB). Each of the surface-coated cutting tools of Examples 1 to 6, in which the coating layer exhibited a peak intensity ratio (IA/IB) of 0.43 or more and 0.86 or less, was found to have a small wear width.

In Comparative examples 1 and 4, the peak intensity ratio (IA/IB) was more than 0.86. In Comparative Examples 2 and 5, the peak intensity ratio (IA/IB) was less than 0.43. In Comparative Examples 3 and 6, no generation of a hexagonal phase was observed. The surface-coated cutting tools of these Comparative Examples were found to have a wear width larger than that of the surface-coated cutting tools of the Examples.

These results indicated that the coating layer exhibiting a peak intensity ratio (IA/IB) of 0.43 or more and 0.86 or less has improved wear resistance in a high-speed cutting process.

Now will be described the relationship between the wear width and the strongest peak in the coating layer as determined through X-ray diffractometry. In Examples 1 to 6, the peak attributed to (200) plane of the cubic phase had the highest peak intensity, and the wear width was small.

In Comparative Example 1, the peak attributed to (111) plane of the cubic phase had the highest peak intensity, and the wear width was larger than that in Examples 1 to 6.

These results indicated that when the peak attributed to (200) plane of the cubic phase has the highest peak intensity, wear resistance is improved in a high-speed cutting process.

4. Effects of Examples

According to the present examples, the surface-coated cutting tool can exhibit improved wear resistance in a high-speed cutting process (i.e., a cutting speed of 250 m/min) and thus exhibit long service life.

<Other Embodiments (Modifications)>

The present invention is not limited to the examples and embodiments described above, but may be implemented in various other forms without departing from the scope of the invention.

(1) The present invention has been described by taking a turning tool as an example in the aforementioned embodiment. However, the present invention can be applied to various cutting tools used for a cutting process. The shape of the tip is not limited to that described above, and the tip may have various shapes.

(2) In the aforementioned embodiment, the proportions of the crystalline phases in the surface coating layer were regulated by controlling the amounts of Al, Ti, and V contained in the alloy target. Instead, the proportions of the crystalline phases in the surface coating layer may be regulated by controlling the composition of the substrate or controlling the conditions for forming the coating layer (layer formation conditions) by means of a cathode arc ion plating apparatus.

1, 10: insert (surface-coated cutting tool)
2: holder for outer diameter finishing
3: clasp
11: tool substrate
13: base
13A: vertex

The invention claimed is:

1. A surface-coated cutting tool comprising a tool substrate containing WC crystal grains and insulating grains, and a coating layer composed of a multiple nitride of Ti, Al, and V and disposed on the surface of the tool substrate, characterized in that
  the multiple nitride is represented by a compositional formula: $Ti_aAl_bV_cN$ satisfying the following relations:

$0.25 \leq a \leq 0.35$, $0.64 \leq b \leq 0.74$, $0 < c \leq 0.06$, and $a+b+c=1$ (wherein each of a, b, and c represents an atomic proportion); and
  the coating layer exhibits a peak attributed to a hexagonal crystal phase and a peak attributed to a cubic crystal phase as observed through X-ray diffractometry,
  wherein the coating layer exhibits a peak intensity ratio (IA/IB) of 0.43 or more and 0.86 or less as determined through X-ray diffractometry, wherein
  IA represents the intensity of the peak attributed to (100) plane of the hexagonal crystal phase, and
  IB represents the intensity of the peak attributed to (200) plane of the cubic crystal phase.

2. A surface-coated cutting tool according to claim 1, wherein the peak attributed to (200) plane of the cubic crystal phase in the coating layer has the highest peak intensity as determined through X-ray diffractometry.

3. A surface-coated cutting tool according to claim 1, wherein the insulating grains are composed of at least one species selected from the group consisting of $Al_2O_3$, SiAlON, and silicon nitride.

4. A surface-coated cutting tool according to claim 1, wherein the tool substrate is bonded to a base via a brazing material, and the base is formed of a cemented carbide.

5. A surface-coated cutting tool according to claim 1, wherein the peak intensity ratio (IA/IB) is 0.43 or more and 0.62 or less.

* * * * *